US006791843B1

(12) United States Patent
Dobbs et al.

(10) Patent No.: US 6,791,843 B1
(45) Date of Patent: Sep. 14, 2004

(54) PARALLEL BOARD CONNECTION SYSTEM AND METHOD

(75) Inventors: Robert W. Dobbs, Granite Bay, CA (US); Stephan K. Barsun, Davis, CA (US); Andrew H. Barr, Roseville, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/459,231

(22) Filed: Jun. 11, 2003

(51) Int. Cl.[7] .......................... H05K 7/00; H05K 7/12; H05K 7/16

(52) U.S. Cl. ....................... 361/758; 361/754; 361/759; 361/742; 361/747; 361/801; 361/740; 361/770

(58) Field of Search ................................ 361/735, 736, 361/740, 742, 747, 752, 754–756, 758, 759, 770, 804, 796–798, 801, 802

(56) References Cited

U.S. PATENT DOCUMENTS

| | | | | | |
|---|---|---|---|---|---|
| 3,701,071 | A | * | 10/1972 | Landman | 200/5 R |
| 4,064,551 | A | | 12/1977 | Lightfoot | |
| 4,161,017 | A | * | 7/1979 | Pierce et al. | 361/784 |
| 4,197,572 | A | | 4/1980 | Aimar | |
| 4,313,150 | A | | 1/1982 | Chu | |
| 4,678,252 | A | * | 7/1987 | Moore | 439/62 |
| 4,863,388 | A | * | 9/1989 | Reimer et al. | 439/31 |
| 4,901,204 | A | * | 2/1990 | Hayashi | 361/807 |
| 5,260,854 | A | * | 11/1993 | Hileman et al. | 361/736 |
| 5,268,820 | A | * | 12/1993 | Tseng et al. | 361/785 |
| 5,373,419 | A | | 12/1994 | Wright | |
| 5,412,540 | A | * | 5/1995 | Golubchik et al. | 361/807 |
| 5,414,594 | A | | 5/1995 | Hristake | |
| 5,442,520 | A | | 8/1995 | Kemp et al. | |
| 5,629,836 | A | | 5/1997 | Wright | |
| 6,088,232 | A | | 7/2000 | Ho | |
| 6,097,591 | A | | 8/2000 | Ircha | |
| 6,234,820 | B1 | * | 5/2001 | Perino et al. | 439/326 |
| 6,270,369 | B1 | * | 8/2001 | Kato et al. | 439/326 |
| 6,288,911 | B1 | * | 9/2001 | Aoki et al. | 361/801 |
| 6,341,063 | B2 | | 1/2002 | Kinoshita et al. | |
| 6,373,712 | B1 | | 4/2002 | Bailis et al. | |
| 6,385,053 | B1 | | 5/2002 | Parizi et al. | |
| 6,411,517 | B1 | | 6/2002 | Babin | |
| 6,437,988 | B1 | | 8/2002 | Treiber et al. | |
| 6,480,391 | B1 | | 11/2002 | Monson et al. | |
| 6,498,730 | B2 | | 12/2002 | Centola et al. | |
| 6,522,554 | B1 | | 2/2003 | Gomez et al. | |
| 6,556,450 | B1 | * | 4/2003 | Rasmussen et al. | 361/754 |
| 6,570,775 | B2 | * | 5/2003 | Lai | 361/801 |

* cited by examiner

*Primary Examiner*—David Martin
*Assistant Examiner*—Dameon E. Levi

(57) ABSTRACT

An electronic system includes a first system component having a first connector and a second system component having a second connector. One of the first system component having the second system component pivots between a first position in which the first connector and the second connector are disconnected and a second position in which the first connector and the second connector are connected.

45 Claims, 3 Drawing Sheets

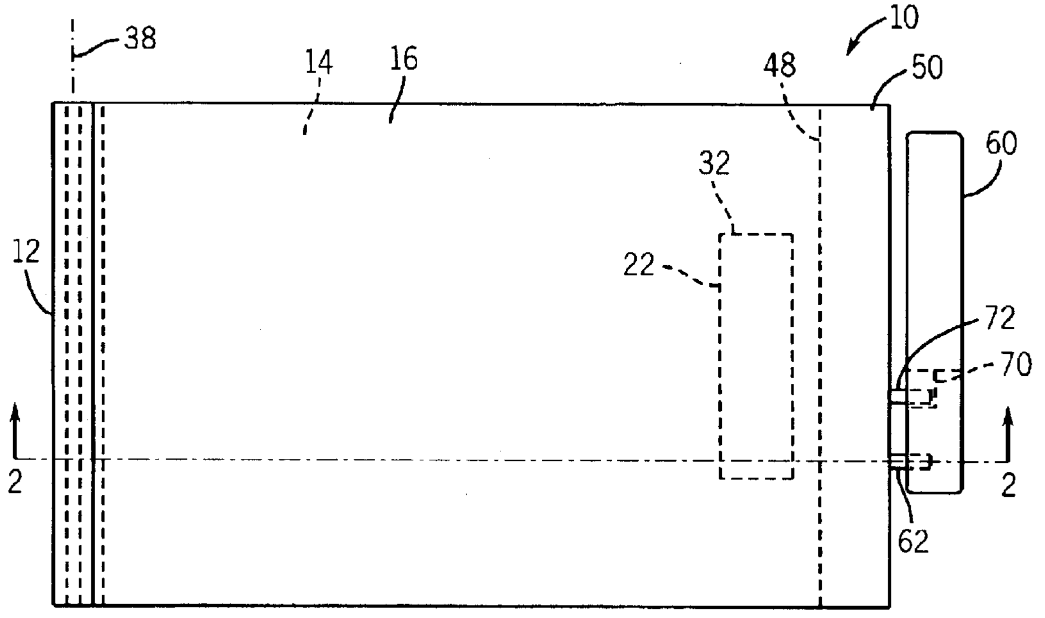
FIG. 1
FIG. 6
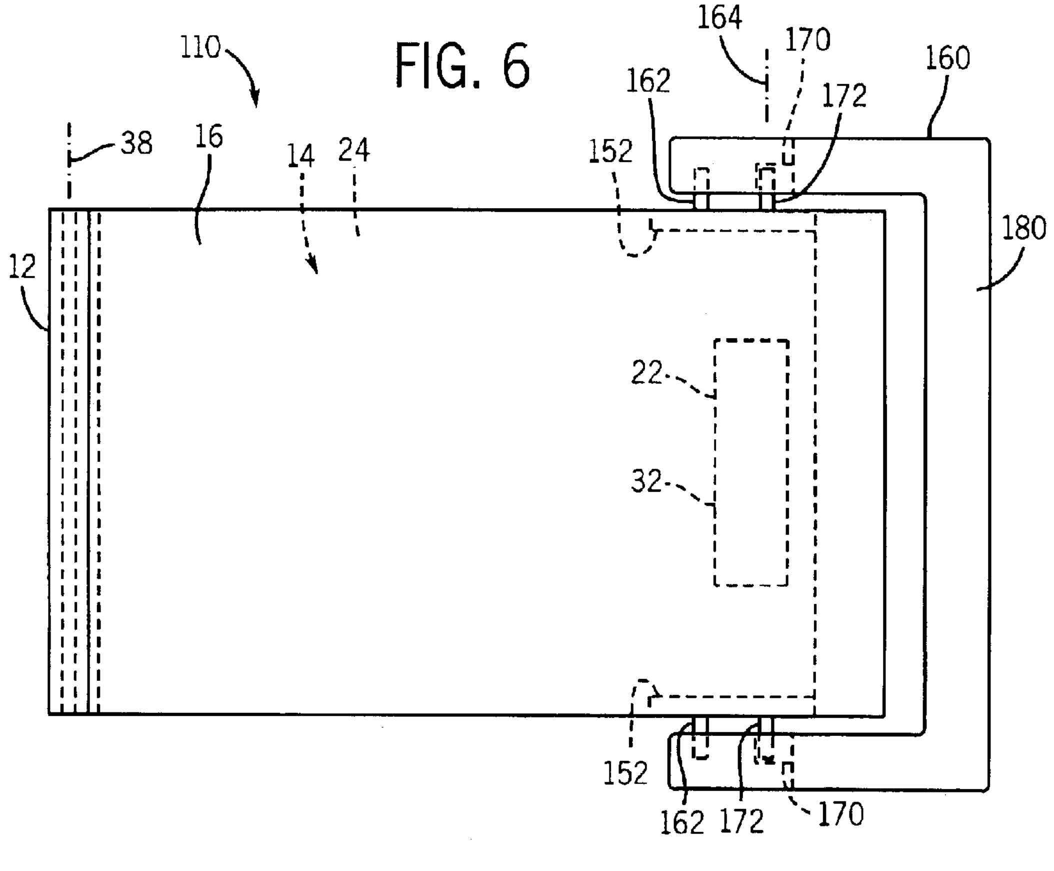

PARALLEL BOARD CONNECTION SYSTEM AND METHOD

BACKGROUND

Electronic systems, such as computer systems, typically include one or more printed circuit boards upon which are affixed active and passive components. In many systems which utilize a plurality of such printed circuit boards, the printed circuit boards are arranged parallel to one another and are directly connected to one another. In many applications, high density pin connectors are required to provide adequate connection between the parallel printed circuit boards. Such high density pin connectors require relatively large amounts of force to ensure proper mating of the connectors. Similarly, large forces are also required to pull apart or unmate the connectors when one of the parallel cards needs to be repaired or replaced.

Connection of the parallel boards is typically accomplished either manually or by using a jack screw. To manually connect the boards, the upper printed circuit board is grasped and lowered so as to position adjacent connectors of the parallel boards in mating engagement. Unfortunately, in many applications the boards are extremely heavy, making assembly difficult and increasing the chance of damage due to misalignment of the connectors or a user's hand slipping and dropping the upper board.

A jack screw typically includes a single screw with mechanical details to allow the jacking screw to push or pull on metal blocks mounted to both printed circuit assemblies and to provide a force to assist in mating or unmating the connectors. Unfortunately, the large mating forces required of high density connectors are difficult to achieve with typical jacking screws. The jacking screw method also typically requires tools which makes assembly and servicing difficult. In addition, both methods fail to keep the assemblies parallel enough to prevent gross and latent defect to the pins and housing of the connector sets or connections to the printed circuit boards.

BRIEF DESCRIPTION OF THE DRAWINGS

FIG. 1 is a top plan view of an example of an electronic system of the present invention.

FIG. 6 is a top plan view of an alternative embodiment of the electronic system of FIG. 1.

BRIEF SUMMARY OF THE INVENTION

Figure 2:
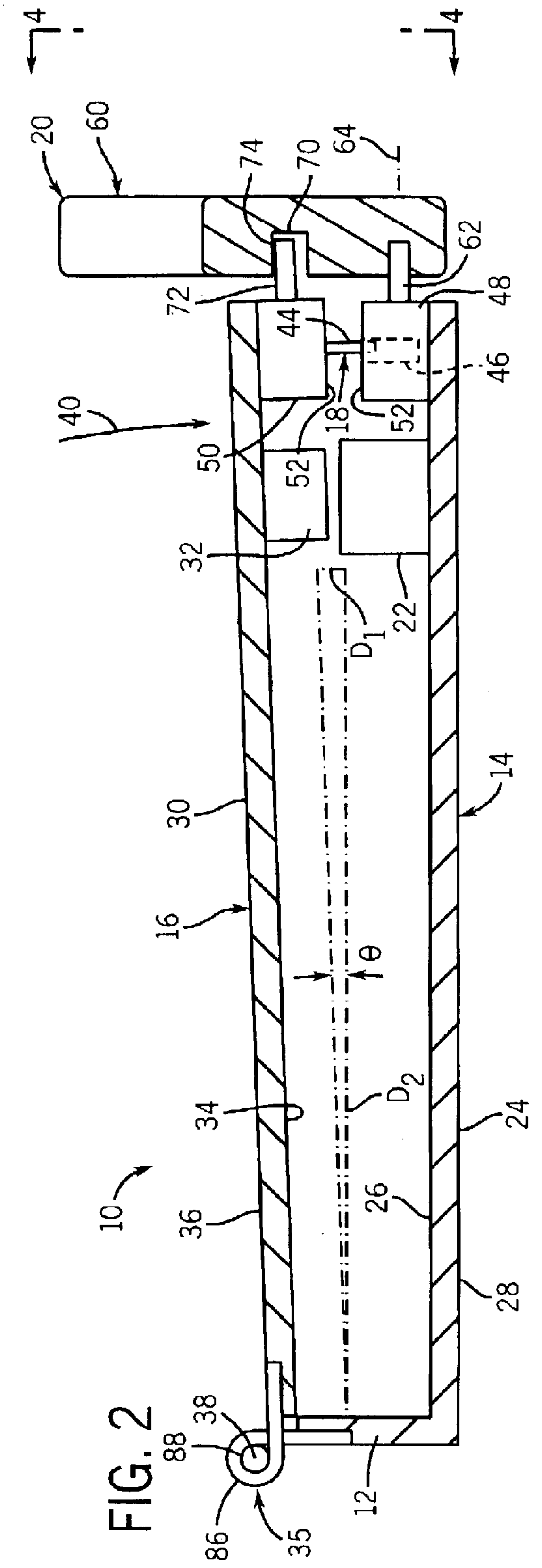
FIG. 2 is a sectional view of the electronic system of FIG. 1 taken along line 2—2 illustrating a printed circuit assembly pivoted to a disconnected state.

According to one example embodiment, an example electronic system includes a first system component having a male projection configured for transmission of signals and a second system component having a female receptacle configured for transmission of signals. One of the fist system component and the second system component pivots about an axis defined by a hinge between a first position in which the male project is removed from the female receptacle and a second position in which the male projection is received within the female receptacle.

DETAILED DESCRIPTION

FIGS. 1–5 illustrate electronic system 10 which generally includes chassis 12, system component 14, printed circuit assembly 16, alignment guide 18 and actuator 20. Chassis 12 generally comprises a structure configured to support system component 14 and printed circuit assembly 16. In particular applications, chassis 12 may also be configured to enclose component 14 and printed circuit assembly 16. Chassis 12 may be formed by one or more interior or exterior walls made of sheet metal or other materials. Chassis 12 may have a variety of different sizes and configurations depending upon the intended uses of electronic system 10.

System component 14 is stationarily coupled to chassis 12 and includes connector 22. For purposes of this disclosure, a system component is a component which performs one or more functions for an electronic system and which transmits or receives data signals to or from another system component by two or more mating connectors which are releasably connected to one another. In the particular embodiment illustrated, system component 14 comprises a backplane or printed circuit assembly including printed circuit board 24 to which connector 22 is affixed. Printed circuit board 24 is generally affixed to an underlying portion of chassis 12 by standoffs or other structures (not shown). Depending upon the dimension of chassis 12 extending between printed circuit board 24 and printed circuit assembly 16, additional active or passive components may be connected to printed circuit board 24 along either face 26 which faces printed circuit assembly 16 or along face 28.

Printed circuit assembly 16 includes printed circuit board 30, connector 32 and one or more active or passive components (not shown) affixed to printed circuit board 30. Such active or passive components may be affixed to either surface 34 which faces component 14 and/or face 36 depending upon the spacing between printed circuit board 30 and printed circuit board 24.

Connector 32 generally comprises a conventionally known or future developed connector affixed to printed circuit board 30 and extending from surface 34 towards connector 22. Connector 32 is generally configured to electrically mate with connector 22 such that data signals may be transmitted across connectors 32 and 22 between printed circuit assembly 16 and system component 14. In the particular embodiment illustrated, connectors 32 and 22 comprise parallel board connectors such as high-density pin connectors. An example of one such connector is TYCO/AMP MICTOR product line connectors which include 266 pin connectors.

As further shown by FIG. 2, printed circuit assembly 16 is pivotally supported relative to system component 14 so as to pivot between a connected position or state in which connectors 32 and 22 mate and connect with another and a disconnected position or state. In the particular embodiment illustrated, printed circuit assembly 16 is pivotally coupled to and supported by chassis 12. In alternative embodiments, printed circuit assembly 16 may be pivotally supported relative to system component 14 by other structures. In the embodiment shown, a hinge 35 pivots printed circuit assembly 16 about axis 38 which is horizontal. As a result, gravity assists in pivoting printed circuit assembly 16 in the direction indicated by arrow 40 towards the connected state or position. Although hinge 35 is illustrated as a mechanical hinge, hinge 38 may alternatively be a flexible material which functions as a living hinge.

Because printed circuit assembly 16 is pivotally supported relative to system component 14, several benefits are achieved. First, the hinge, the mechanical or living hinge pivotally supporting printed circuit assembly 16 enables precise control of printed circuit assembly 16 during connection and disconnection of connectors 32 and 22. Second, by retaining one edge of printed circuit assembly 16 relative to the rest of the product or electronic system 10, hinge 35 allows the weight of printed circuit assembly 16 to be partially carried by chassis 12 or the another structure supporting hinge 35 during servicing and installation. Third, hinge 35 facilitates service access to both sides of printed circuit assembly 16, including surfaces 34 and 36 of printed circuit board 30, as well as any components carried on printed circuit board 30, without requiring detachment of printed circuit assembly 16. Fourth, hinge 35 facilitates tool-less assembly and servicing of printed circuit assembly 16.

The broken or dashed lines in FIG. 2 illustrate relative geometries of system 10. In particular, connectors 32 and 22 have maximum tolerances for angular deviation of their mating portions. In other words, to ensure proper mating and to avoid damage to connectors 32 and 22, mating portions (such as, pins and pin holes) may be out of precise alignment with one another by a predetermined amount represented by angle θ. Connectors 32 and 22 also have a mating engagement distance D1 during which the mating portions of connectors 32 and 22 mate (such as when the pins make electrical contact with pin holes or bores). Based upon such information, those mating portions of connector 22 closest to axis 38 are generally spaced from axis 38 by a distance D2.

In the particular embodiment illustrated in which connectors 22 and 32 comprise 266 pin connectors of the MICTOR product line, it has been found that angle θ is less than or equal to 1.5 degrees (many connectors have specification tolerances of 2 degrees), while the engagement distance D1 is less than 0.24 inches. As a result, the closest mating portion of connector 22 is spaced from axis 38 by a distance D2 of at least 9.2 inches.

Alignment guide 18 further assists in aligning those mating portions of connectors 32 and 22 during connection. Alignment guide 18 includes at least one course alignment pin 44 and at least opposite corresponding course alignment bore or recess 46. Course alignment pins 44 are fixedly coupled to one of printed circuit assembly 16 and system component 14 while course alignment recess 46 is fixedly coupled to the other of printed circuit assembly 16 and system component 14. Recess 46 is configured to receive pin 44 when connectors 32 and 22 are in course alignment with one another. As a result, pin 44 and recess 46 assist in preventing damage to the mating portions of connectors 32 and 22.

In the particular embodiment illustrated, recess 46 is formed in a body 48 affixed to printed circuit board 24. Pin 44 is integrally formed as part of a single unitary body with a rigid body 50 affixed to printed circuit board 30. Alternatively, pin 44 may be captured within, fastened, adhered, welded or otherwise mounted to body 50. In addition to supporting or providing pin 44 and receptacle 46, bodies 50 and 48 also provide opposing stop surfaces 52 that abut one another to indicate when printed circuit assembly 16 has been sufficiently pivoted about axis 38 to sufficiently connect connectors 32 and 22 and to also prevent damage to connectors 32 and 22 caused by over rotation of printed circuit assembly 16 about axis 38.

In alternative embodiments, one of pin 44 or receptacle 46 may be provided by or coupled to a structure other than system component 14. Likewise, body 50 may alternatively be coupled to a structure other than component 14, such as an adjacent portion of chassis 12. In such alternative embodiments, one of pin 44 and receptacle 46, and body 50, are still coupled indirectly to printed circuit assembly 16.

Figure 3:
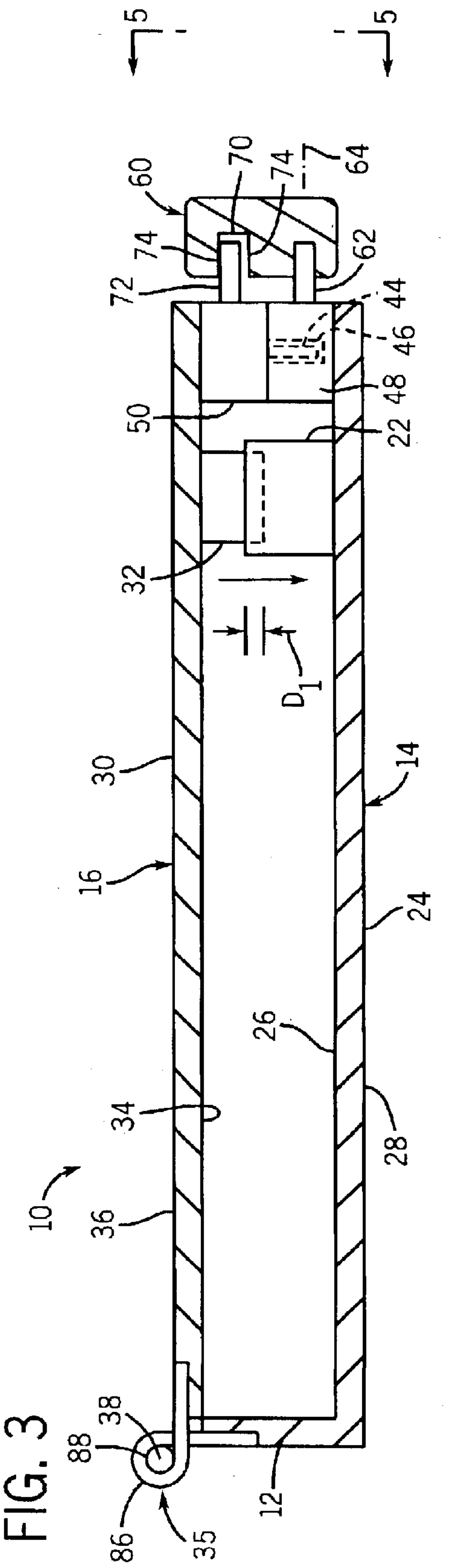
FIG. 3 is a sectional view of the electronic system of FIG. 1 pivoted to a connected state.

Actuator 20 assists in pivoting printed circuit assembly 16 about axis 38 between the disconnected position (shown in FIG. 2) and the connected position (shown in FIG. 3). In the particular embodiment illustrated, actuator 20 includes a lever 60 coupled to printed circuit assembly 16 and also coupled to system component 14. lever 60 of actuator 20 is configured to be rotated so as to move printed circuit assembly 16 between the connected position and the disconnected position. Lever 60 is generally configured to be manually grasped by an individual and to be rotated as a result of force or torque exerted by the individual. Lever 60 provides a lever arm so as to magnify or multiply the actual force applied by the individual, wherein the magnified or multiplied force is transmitted to printed circuit assembly 16 to attain the forces required for connecting or disconnecting connectors 32 and 22.

As best shown by FIGS. 2–5, lever 60 is pivotably coupled to system component 14 by a pivot pin 62 extending from body 48. Lever 60 rotates or pivots about an axis 64 provided by pin 62. Axis 64 generally extends perpendicular to axis 38 about which printed circuit assembly 16 pivots. Although pivot pin 62 is illustrated as extending from body 48, pivot pin 62 may alternatively extend from other structures which are stationarily supported relative to system component 14, such as chassis 12.

As further shown by FIGS. 2–5, lever 60 includes a channel, groove or slot 70. Slot 70 slidably receives extension 72 and is formed in lever 60. Alternatively, slot 70 may be formed in another structure coupled to level 60. Slot 70 is generally bound by engagement surfaces 74 formed within lever 60.

Extension 72 generally comprises a projection fixedly coupled to printed circuit assembly 16 so as to move with printed circuit assembly 16. In the particular embodiment illustrated, extension 72 comprises a pin extending from body 50. In alternative embodiments, extension 72 may extend from other structures fixedly coupled to printed circuit assembly 16.

Figure 4:
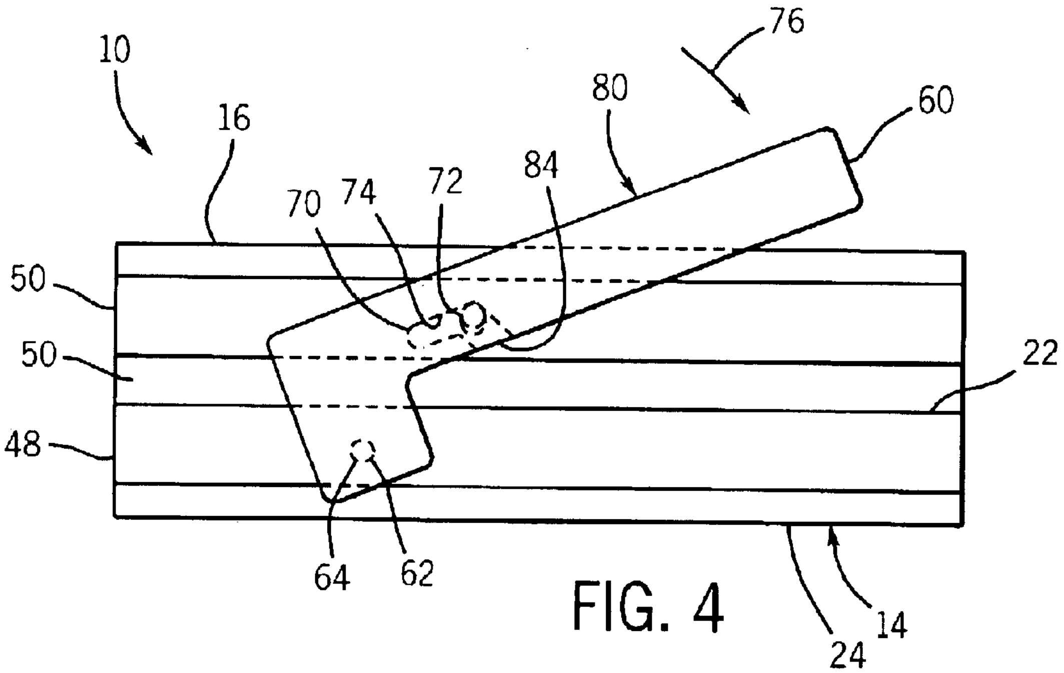
FIG. 4 is an end elevational view of the electronic system of FIG. 2 taken along line 4—4.
Figure 5:
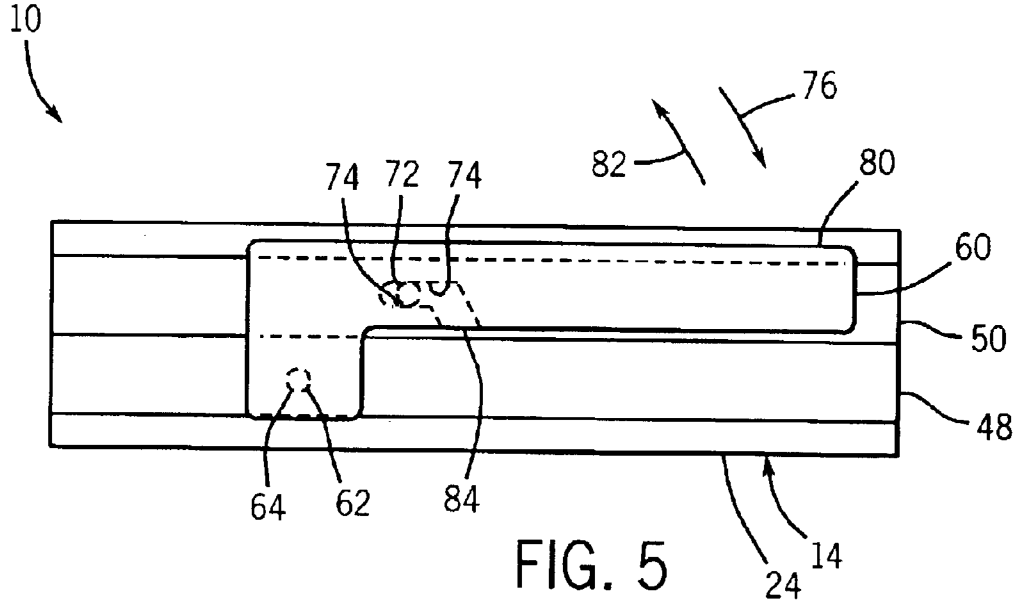
FIG. 5 is an end elevational view of the electronic system of FIG. 3 taken along line 5—5.

As best shown by FIGS. 4 and 5, pivotal movement of lever 70 about axis 64 results in engagement surfaces 74 contacting extension 72 to apply force to extension 72. The force exerted upon extension 72 by engagement surface 74 is greater than the force applied proximate to gripping area 80 of lever 70 by an individual. This is the result of the lever arm created by lever 70. In the particular embodiment illustrated,. lever 70 is dimensioned so as to provide a lever arm which results in the multiplication of force by a ratio of at least 10 to 1 between the surface of lever 70 intended to be gripped by an individual and the engagement of engagement surface 74 with extension 72. This force enables connectors 32 and 22 to securely mate with one another.

To separate connectors 32 and 22, lever 70 is rotated by the individual about axis 64 in an opposite direction as indicated by arrow 82 in FIG. 5. Consequently, an opposite engagement surface 74 engages extension 72 to multiply the force exerted upon the gripping portion 80 of lever 70. This magnification of the force enables connectors 32 and 22 to be disconnected from one another.

In the particular embodiment illustrated, connectors 32 and 22 have approximately a 66.5 pound mating force requirement. It has been found that any force requirements greater than 15 pounds are generally objectionable. Lever 70 enables an individual to meet the mating force requirement without having to excessively press upon printed circuit assembly 16.

As further shown by FIGS. 4 and 5, slot 70 further includes an opening 84 through which extension 72 may be removed from slot 84. As a result, printed circuit assembly 16 may be disconnected from actuator 60, permitting printed circuit assembly 16 to be pivoted completely away from actuator 60 about axis 38 for accessing and servicing components affixed to surface 34. In the particular embodiment illustrated, hinge 35 is releasably coupled to at least one of chassis 12 and printed circuit assembly 16 such that printed circuit assembly 16 may be completely removed from electronic system 10 for repair or replacement. In one embodiment, hinge 35 and chassis 12 include mating interleaved knuckles 86 which are joined by a pivot pin 88 inserted through the mating knuckles 86. In still other embodiments, hinge 35 may be formed by one or more structures permanently or releasably secured to one or both of chassis 12 and printed circuit assembly 16 and providing an alternative mechanical hinge or a living hinge formed from flexible material.

FIG. 6 is a top plan view illustrating electronic system 110, an alternative embodiment of system 10 shown in FIGS. 1–5. System 110 is similar to system 10 except that system 110 includes lever 160, pivot pins 162 and extensions 172 in lieu of lever 60, pivot pin 62 and extension 72, respectively. System 110 additionally includes bodies 152. For ease of illustration, those remaining components of system 110 which correspond to components of system 10 are numbered similarly. Bodies 152 generally comprise rigid members, such as metal blocks, that extend along at least side edge portions of system component 14. In the particular embodiment illustrated in which system component 14 comprises a printed circuit assembly, bodies 152 extend along side edges of printed circuit board 24. Bodies 152 couple pivot pins 162 to component 14. In alternative embodiments, bodies 152 may be omitted wherein pivot pins 162 extend from other stationary structures adjacent to component 14 such as chassis 12.

Pivot pins 162 extend into pivotal engagement with lever 160. Pivot pins 162 pivotally support lever 160 for pivotal movement about axis 164. Axis 164 generally extends parallel to axis 38. In the particular embodiment illustrated, axis 164 is horizontal such that gravity assists in pivoting printed circuit assembly 16 between a connected state and a disconnected state.

Extensions 172 extend outwardly from printed circuit assembly 16 or structures coupled to printed circuit assembly 16 such as a body similar to body 50 shown in FIG. 2.

Lever 160 includes a pair of inwardly facing grooves, channels or slots 170 which are configured substantially identical to slots 70. Slots 170 include engagement surfaces similar to engagement surfaces 74. Rotation of lever 160 in a fashion similar to that shown in FIGS. 4 and 5 with respect to lever 60 brings the engagement surfaces 74 into engagement with extensions 172 to pivot printed circuit assembly 16 about axis 38 so as to connect or disconnect connectors 32 and 22. Like lever 60, lever 160 creates a lever arm that multiplies the force being applied to the gripping portion 180 such that the larger mating and unmating forces required by connectors 32 and 22 may be met.

Although the present invention has been described with reference to example embodiments, workers skilled in the art will recognize that changes may be made in form and detail without departing from the spirit and scope of the invention. For example, although different example embodiments may have been described as including one or more features providing one or more benefits, it is contemplated that the described features may be interchanged with one another or alternatively be combined with one another in the described example embodiments or in other alternative embodiments. Because the technology of the present invention is relatively complex, not all changes in the technology are foreseeable. The present invention described with reference to the example embodiments and set forth in the following claims is manifestly intended to be as broad as possible. For example, unless specifically otherwise noted, the claims reciting a single particular element also encompass a plurality of such particular elements.

What is claimed is:

1. An electronic system comprising:

a first printed circuit assembly having a first connector including a male projection configured for the transmission of signals; and a second printed circuit assembly having a second connector including a female receptacle configure for the transmission of signals, wherein the second printed circuit assembly is pivotably coupled to the first printed circuit assembly by a hinge and wherein at least one the first printed circuit assembly and the second printed circuit assembly pivots between a first position in which the male projection is sufficiently removed from the female receptacle such that the first connector and the second connector are disconnected and a second position in which the male projection is sufficiently received within the female receptacle to connect the first connector and the second connector; and a lever coupled to the first printed circuit assembly and the second printed circuit assembly, wherein rotation of the lever moves the second printed circuit assembly from the first position to the second position.

2. The system of claim 1, wherein the second printed circuit assembly extends parallel to the first printed circuit assembly in the second position.

3. system of claim 1 including an extension extending from the second printed circuit assembly and wherein the extension is slidably coupled to the lever.

4. The system of claim 1, wherein the second printed circuit assembly is releasably coupled to the lever.

5. The system of claim 3, wherein one of the lever and the extension includes a groove and wherein the other of the lever and the extension includes a projection movable within the groove.

6. The system of claim 1, including a chassis pivotally supporting the second printed circuit assembly.

7. The system of claim 6, wherein the second printed circuit assembly is releasably coupled to the chassis.

8. The system of claim 1 including a body coupled to the first printed circuit assembly and pivotally supporting the lever.

9. The system of claim 1 including an actuator configured to pivot the second printed circuit assembly from the first position to the second position.

10. The system of claim 7 including an actuator configured to pivot the second printed circuit assembly from the first position to the second position.

11. The system of claim 1 including an actuator configured to pivot the second printed circuit assembly from the second position to the first position.

12. The system of claim 1, wherein the first printed circuit assembly extends along a first plane and wherein the lever pivots about an axis within the plane or parallel to the plane.

13. The system of claim 1 including:

at least one course alignment pin coupled to one of the first printed circuit assembly and the second printed circuit assembly; and at least one course alignment receptacle coupled to the other of the first printed circuit assembly and the second printed assembly, wherein the at least one course alignment pin and the at least one course alignment receptacle mate during pivoting of the second printed circuit assembly towards the first printed circuit assembly and wherein the receptacle at least partially receives the pin prior to engagement of the second connector with the first connector to facilitate alignment of the second connector and the first connector.

14. The system of claim 1 including:

a first stop surface coupled to the first printed circuit assembly; and a second stop surface coupled to the second printed circuit assembly, wherein the second stop surface engages the first stop surface when the second connector is connected to the first connector to limit pivoting of the second printed circuit assembly.

15. The system of claim 1 including means coupled to the second printed circuit board for multiplying an applied manual force and transmitting the multiplied applied manual force to the second printed circuit assembly to urge the second printed circuit assembly towards one of the first position and the second position.

16. The system of claim 15, wherein the multiplying means multiplies the applied manual force by at least 10.

17. The system of claim 1, wherein the second printed circuit assembly pivots about a horizontal axis.

18. The system of claim 1, wherein the second printed circuit assembly pivots between the first position and the second position about a first axis and wherein the system further includes a lever coupled to the first printed circuit assembly and the second printed circuit assembly, wherein the lever rotates about a second axis parallel to the first axis and wherein rotation of the lever about the second axis moves the second printed circuit assembly between the first position and the second position.

19. The system of claim 1, wherein the second printed circuit assembly pivots between the first position and the second position about a first axis and wherein the system further includes a lever coupled to the first printed circuit assembly and the second printed circuit assembly, wherein the lever rotates about a second axis perpendicular to the first axis and wherein rotation of the lever about the second axis moves the second printed circuit assembly between the first position and the second position.

20. A method for connecting and disconnecting a first connector having a male projection configured for the transmission of signals from a first printed circuit assembly to a second connector having a female receptacle configured for the transmission of signals from a second printed circuit assembly, the method comprising:

pivoting at least one first printed circuit assembly and the second printed circuit assembly about a hinge towards one another until the male projection is sufficiently received within the female receptacle to connect the first connector to the second connector;

pivoting the second printed circuit assembly about the hinge away from the first printed circuit board until the male projection is sufficiently removed from the female receptacle such that the first connector and the second connector are disconnected;

applying a first manual force;

magnifying the manual force using a lever; and transmitting the magnified manual force to the second printed circuit assembly to pivot the second printed circuit assembly.

21. The method of claim 20, wherein the lever is couple to the second printed circuit assembly and wherein the lever provides a lever arm to magnify the manual force applied to the lever.

22. An electronic system comprising:

a system component having a male projection configured for the transmission of signals;

a first printed circuit assembly having a female receptacle configured for the transmission of signals, wherein one of the system component and the printed circuit assembly pivots about an axis defined by a hinge between a first position in which the male projection is removed from the female receptacle and a second position in which the male projection is received within the female receptacle; and a lever coupled to the system component and the printed circuit assembly, wherein rotation of the lever moves said one of the system component and the first printed circuit board between the first position and the second position.

23. The system of claim 22, wherein the system component comprises a second printed circuit assembly.

24. The system of claim 23, wherein the second printed circuit assembly extends parallel to the first printed circuit assembly when said one of the first printed circuit assembly and the system component is in the second position.

25. The system of claim 22 including a chassis pivotally supporting said one of the system component and the printed circuit board.

26. An electronic system comprising:

a first system component having a male projection configured for the transmission of signals;

a second system component having a female receptacle configured for the transmission of signals, wherein one of the first system component and the second system component pivots about an axis defined by a hinge between a first position in which the male projection is removed from the female receptacle and a second position in which the male projection is received within the female receptacle; and a lever coupled to one of the first component and the second component, wherein pivoting of the lever moves one of the first component and the second component towards the other of the first component and the second component.

27. The system of claim 1 including an extension coupled to the second printed circuit board and extending beyond an edge of the second printed circuit board, wherein the extension is configured to be engaged during pivoting of the second printed circuit board.

28. The system of claim 1 wherein the first connector and the second connector have a mating distance $D_1$, wherein the first connector and the second connector have a tolerance of $\theta$ degrees and wherein the second connector has a closest signal transmitting mating portion spaced from an axis of the hinge by a distance $D_2 > D_1/\tan\theta$.

29. A system of claim 1, wherein the second printed circuit assembly includes a printed circuit board and wherein the female receptacle faces away from the printed circuit board.

30. The system of claim 1, wherein the first connector has a plurality of male projections including the male projection and wherein the second connector has a plurality of female receptacles including the female receptacle.

31. The system of claim 30, wherein the second printed circuit assembly includes a printed circuit board and wherein each of the plurality of receptacles faces away from the printed circuit board.

32. The system of claim 1, wherein the hinge is coupled to the first printed circuit assembly at a proximal end portion and wherein the first connector is proximate a distal end portion of the first printed circuit assembly.

33. A method of claim 20, wherein the second printed circuit assembly includes a printed circuit board and wherein the female receptacle faces away from the printed circuit board.

34. The method of claim 20, wherein the first connector has a plurality of male projections including the male projection and wherein the second connector has a plurality of female receptacles including the female receptacle.

35. The method of claim 34, wherein the second printed circuit assembly includes a printed circuit board and wherein each of the plurality of receptacles faces away from the printed circuit board.

36. The method of claim 20, wherein the hinge is coupled to the first printed circuit assembly at a proximal end portion and wherein the first connector is proximate a distal end portion of the first printed circuit assembly.

37. The system of claim 26, wherein the female receptacle faces away from the remainder of the second system component.

38. The system of claim 26, wherein the first system component includes a plurality of male projections including the male projection and wherein the second system component includes a plurality of female receptacles including the female receptacle.

39. The system of claim 38, wherein each of the plurality of female receptacles faces away from the remainder of the second system component.

40. The system of claim 29, wherein the hinge is coupled to the first system component at a proximal end portion and wherein the male projection is proximate a distal end portion of the first system component.

41. An electronic system comprising:

a first printed circuit assembly having a first connector;

a second printed circuit assembly having a second connector, wherein the second printed circuit assembly pivots between a first position in which the second connector is disconnected from the first connector and a second position in which the second connector is connected to the first connector; and a lever coupled to the first printed circuit assembly and the second printed circuit assembly, wherein rotation of the lever moves the second printed circuit assembly from the first position to the second position.

42. An electronic system comprising:

a first printed circuit assembly having a first connector configured for the transmission of signals;

a second printed circuit assembly having a second connector configured for the transmission of signals, wherein the second printed circuit assembly is pivotably coupled to the first printed circuit assembly by a hinge and wherein the second printed circuit assembly pivots between a first position in which the second connector is disconnected from the first connector and a second position in which the second connector is connected to the first connector; and at least one course alignment pin coupled to one of the first printed circuit assembly and the second printed circuit assembly; and at least one course alignment receptacle coupled to the other of the first printed circuit assembly and the second printed assembly, wherein the at least one course alignment pin and the at least one course alignment receptacle mate during pivoting of the second printed circuit assembly towards the first printed circuit assembly and wherein the receptacle at least partially receives the pin prior to engagement of the second connector with the first connector to facilitate alignment of the second connector and the first connector.

43. A method for connecting and disconnecting a first connector of a first printed circuit assembly to a second connector of a second printed circuit assembly, the method comprising:

applying a first manual force;

magnifying the manual force using a lever;

transmitting the magnified manual force to the second printed circuit assembly to pivot a portion of the second printed circuit board towards the first printed circuit assembly until the second connector is connected to the first connector; and pivoting the second printed circuit assembly away from the first printed circuit board until the second connector is disconnected from the first connector.

44. An electronic system comprising:

a first printed circuit assembly having a first connector including a male projection configured for the transmission of signals;

a second printed circuit assembly having a second connector including a female receptacle configured for the transmission of signals, wherein the second printed circuit assembly is pivotably coupled to the first printed circuit assembly by a hinge and wherein at least one of the first printed circuit assembly and the second printed circuit assembly pivots between a first position in which the male projection is sufficiently removed from the female receptacle such that the first connector and the second connector are disconnected and a second position in which the male projection is sufficiently received within the female receptacle to connect the first connector and the second connector;

at least one course alignment pin coupled to one of the first printed circuit assembly and the second printed circuit assembly; and at least one course alignment receptacle coupled to the other of the first printed circuit assembly and the second printed assembly, wherein the at least one course alignment pin and the at least one course alignment receptacle mate during pivoting of the second printed circuit assembly towards the first printed circuit assembly and wherein the receptacle at least partially receives the pin prior to engagement of the second connector with the first connector to facilitate alignment of the second connector and the first connector.

45. An electronic system comprising:

a first printed circuit assembly having a first connector including a male projection configured for the transmission of signals;

a second printed circuit assembly having a second connector including a female receptacle configured for the transmission of signals, wherein the second printed circuit assembly is pivotably coupled to the printed circuit assembly by a hinge and wherein at least one of the first printed circuit assembly and the second printed circuit assembly pivots between a first position in which the male projection is sufficiently removed from the receptacle such that the first connector and the second connector are disconnected and a second position in which the male projection is sufficiently received within the female receptacle to connect the first connector and the second connector;

a first stop surface coupled to the first printed circuit assembly; and a second stop surface couple to the second printed circuit assembly, wherein the second stop surface engages the first stop surface when the second connector is connected to the first connector to limit pivoting of the printed circuit assembly.

* * * * *